US012765175B2

(12) United States Patent
Kim et al.

(10) Patent No.: US 12,765,175 B2
(45) Date of Patent: Oct. 13, 2026

(54) DISPLAY DEVICE AND METHOD OF MANUFACTURING THE SAME

(71) Applicant: Samsung Display Co., Ltd., Yongin-si (KR)

(72) Inventors: Tae Hyun Kim, Yongin-si (KR); Kwang Su Park, Yongin-si (KR); Su Ah Oh, Yongin-si (KR); Si Jun Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 284 days.

(21) Appl. No.: 18/613,720

(22) Filed: Mar. 22, 2024

(65) Prior Publication Data

US 2024/0431142 A1 Dec. 26, 2024

(30) Foreign Application Priority Data

Jun. 26, 2023 (KR) ........................ 10-2023-0082161

(51) Int. Cl.
*H10K 59/121* (2023.01)
*H10K 59/12* (2023.01)
*H10K 59/131* (2023.01)

(52) U.S. Cl.
CPC ..... *H10K 59/1216* (2023.02); *H10K 59/1201* (2023.02); *H10K 59/131* (2023.02)

(58) Field of Classification Search
CPC ........... H10K 59/1216; H10K 59/1201; H10K 59/131; H10K 59/1213; H10K 71/60; G09G 3/3233; G09G 2300/0426; G09G 2300/0852
See application file for complete search history.

(56) References Cited

U.S. PATENT DOCUMENTS

| | | | | |
|---|---|---|---|---|
| 2007/0114918 | A1* | 5/2007 | Arai | G09G 3/006 313/504 |
| 2019/0096924 | A1* | 3/2019 | Ren | H10D 86/423 |
| 2021/0333664 | A1 | 10/2021 | Shan | |
| 2021/0391402 | A1 | 12/2021 | Song et al. | |

FOREIGN PATENT DOCUMENTS

| | | | |
|---|---|---|---|
| CN | 109709733 | A | 5/2019 |
| CN | 110416278 | A | 11/2019 |
| CN | 113050335 | A | 6/2021 |
| KR | 10-20190072217 | A | 6/2019 |

* cited by examiner

*Primary Examiner* — Mary Ellen Bowman
(74) *Attorney, Agent, or Firm* — Innovation Counsel LLP

(57) ABSTRACT

A display device includes: a substrate; a first conductive layer including gate electrodes respectively disposed in pixel circuit areas arranged in a first direction on the substrate; a second conductive layer disposed on the first conductive layer, the second conductive layer including first bridge patterns; a third conductive layer disposed on the second conductive layer, the third conductive layer including a voltage supply line for supplying a driving voltage and second bridge patterns; and a fourth conductive layer disposed on the third conductive layer, the fourth conductive layer including common electrode lines which are electrically connected to the gate electrodes through the first and second bridge patterns and are electrically disconnected from the voltage supply line. The common electrode lines are arranged in a second direction intersecting the first direction, and each of the common electrode lines extends in the first direction to overlap with the pixel circuit areas.

15 Claims, 11 Drawing Sheets

DISPLAY DEVICE AND METHOD OF MANUFACTURING THE SAME

CROSS-REFERENCE TO RELATED APPLICATION

The present application claims priority under 35 U.S.C. § 119(a) to Korean patent application No. 10-2023-0082161 filed on Jun. 26, 2023, in the Korean Intellectual Property Office, the entire disclosure of which is incorporated herein by reference.

BACKGROUND

1. Technical Field

The present disclosure generally relates to a display device, and more particularly, to a display device for allowing a storage capacitor to be shared between sub-pixels and a method of manufacturing the display device.

2. Related Art

Multimedia electronic devices, such as televisions, mobile phones, tablet computers, navigation devices, and game machines, may include display devices for displaying images. Recently, an organic light emitting diode display (OLED) as one of the display devices has a self-luminous characteristic, and does not require a separate light source, making it possible to reduce thickness and weight thereof. Further, the OLED has high-quality characteristics such as low power consumption, high luminance, and high response speed. Thus, the OLED has come into the spotlight as a next-generation display device for portable electronic devices.

The OLED includes a plurality of pixels emitting lights of different colors, and a circuit including a plurality of transistors and a plurality of capacitors, which are used to drive an organic light emitting diode, is formed in each pixel. In particular, a circuit including a minimum number of transistors and a minimum number of capacitors for the purpose of 4K pixel design is formed in a micro organic light emitting display device.

The above information disclosed in this Related Art section is only for enhancement of understanding of the background of the invention and therefore it may contain information that does not form the prior art that is already known to a person of ordinary skill in the art.

SUMMARY

Embodiments provide a display device capable of including electric elements with an ultra-high resolution in a relatively small area, and a method of manufacturing the display device. For example, in the display device, a storage capacitor may be shared between sub-pixels, and accordingly, a design space for various components included in the display device can be secured. Thus, electric elements with an ultra-high resolution can be included in a relatively small area.

In accordance with an aspect of the present disclosure, there is provided a display device including: a substrate; a first conductive layer including gate electrodes respectively disposed in pixel circuit areas arranged in a first direction on the substrate; a second conductive layer disposed on the first conductive layer, the second conductive layer including first bridge patterns; a third conductive layer disposed on the second conductive layer, the third conductive layer including a voltage supply line for supplying a driving voltage and second bridge patterns; and a fourth conductive layer disposed on the third conductive layer, the fourth conductive layer including common electrode lines which are electrically connected to the gate electrodes through the first bridge patterns and the second bridge patterns and are electrically disconnected from the voltage supply line, wherein the common electrode lines are arranged in a second direction intersecting the first direction, and each of the common electrode lines extends in the first direction to overlap with the pixel circuit areas.

Each of the common electrode lines along with the voltage supply line may form a first storage capacitor.

Each of the first bridge patterns along with the voltage supply line may form a second stage capacitor.

The voltage supply line may extend in the first direction to overlap with the pixel circuit areas.

Pixel circuits of sub-pixels included in one unit pixel may be disposed in the pixel circuit areas, and the gate electrodes may be respectively included in the pixel circuits of the sub-pixels.

A number of the common electrode lines in the one unit pixel may be equal to a number of the sub-pixels included in the one unit pixel.

The first bridge patterns and the second bridge patterns may overlap with each other. The common electrode lines may be connected to the second bridge patterns through first contact holes. The second bridge patterns may be connected to the first bridge patterns through second contact holes.

The common electrode lines in one unit pixel are connected to the second bridge patterns through the first contact holes, respectively.

The display device may further include a fifth conductive layer including a data line for supplying a data signal and disposed between the first conductive layer and the second conductive layer.

The fifth conductive layer may further include third bridge patterns. The common electrode lines may be electrically connected to the gate electrodes through the first bridge patterns, the second bridge patterns, and the third bridge patterns.

The second conductive layer may further include gate lines for supplying a gate signal.

In accordance with another aspect of the present disclosure, there is provided a method of manufacturing a display device, the method including: forming a first conductive layer including gate electrodes respectively disposed in pixel circuit areas arranged in a first direction on a substrate; forming a second conductive layer disposed on the first conductive layer, the second conductive layer including first bridge patterns; forming a third conductive layer disposed on the second conductive layer, the third conductive layer including a voltage supply line for supplying a driving voltage and second bridge patterns; and forming a fourth conductive layer disposed on the third conductive layer, the fourth conductive layer including common electrode lines which are electrically connected to the gate electrodes through the first bridge patterns and the second bridge patterns and are electrically disconnected from the voltage supply line, wherein the common electrode lines are arranged in a second direction intersecting the first direction, and each of the common electrode lines extends in the first direction to overlap with the pixel circuit areas.

Each of the common electrode lines along with the voltage supply line may form a first storage capacitor.

Each of the first bridge patterns along with the voltage supply line may form a second stage capacitor.

The voltage supply line may extend in the first direction to overlap with the pixel circuit areas.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments of the present disclosure will be described in more detail with reference to the accompanying drawings. In the description below, only a necessary part to understand an operation according to the present disclosure is described and the descriptions of other parts are omitted in order not to unnecessarily obscure subject matters of the present disclosure. In addition, the present disclosure is not limited to exemplary embodiments described herein, but may be embodied in various different forms. Rather, exemplary embodiments described herein are provided to thoroughly and completely describe the disclosed contents and to sufficiently transfer the ideas of the disclosure to a person of ordinary skill in the art.

In the entire specification, when an element is referred to as being "connected" or "coupled" to another element, it can be directly connected or coupled to the another element or be indirectly connected or coupled to the another element with one or more intervening elements interposed therebetween. The technical terms used herein are used only for the purpose of illustrating a specific embodiment and not intended to limit the embodiment. It will be understood that when a component "includes" an element, unless there is another opposite description thereto, it should be understood that the component does not exclude another element but may further include another element. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Similarly, for the purposes of this disclosure, "at least one selected from the group consisting of X, Y, and Z" can be construed as X only, Y only, Z only, or any combination of two or more items X, Y, and Z (e.g., XYZ, XYY, YZ, ZZ).

It will be understood that, although the terms "first", "second," etc. may be used herein to describe various elements, these elements should not be limited by these terms. These terms are only used to distinguish one element from another element. Thus, a "first" element discussed below could also be termed a "second" element without departing from the teachings of the present disclosure.

Figure 1:
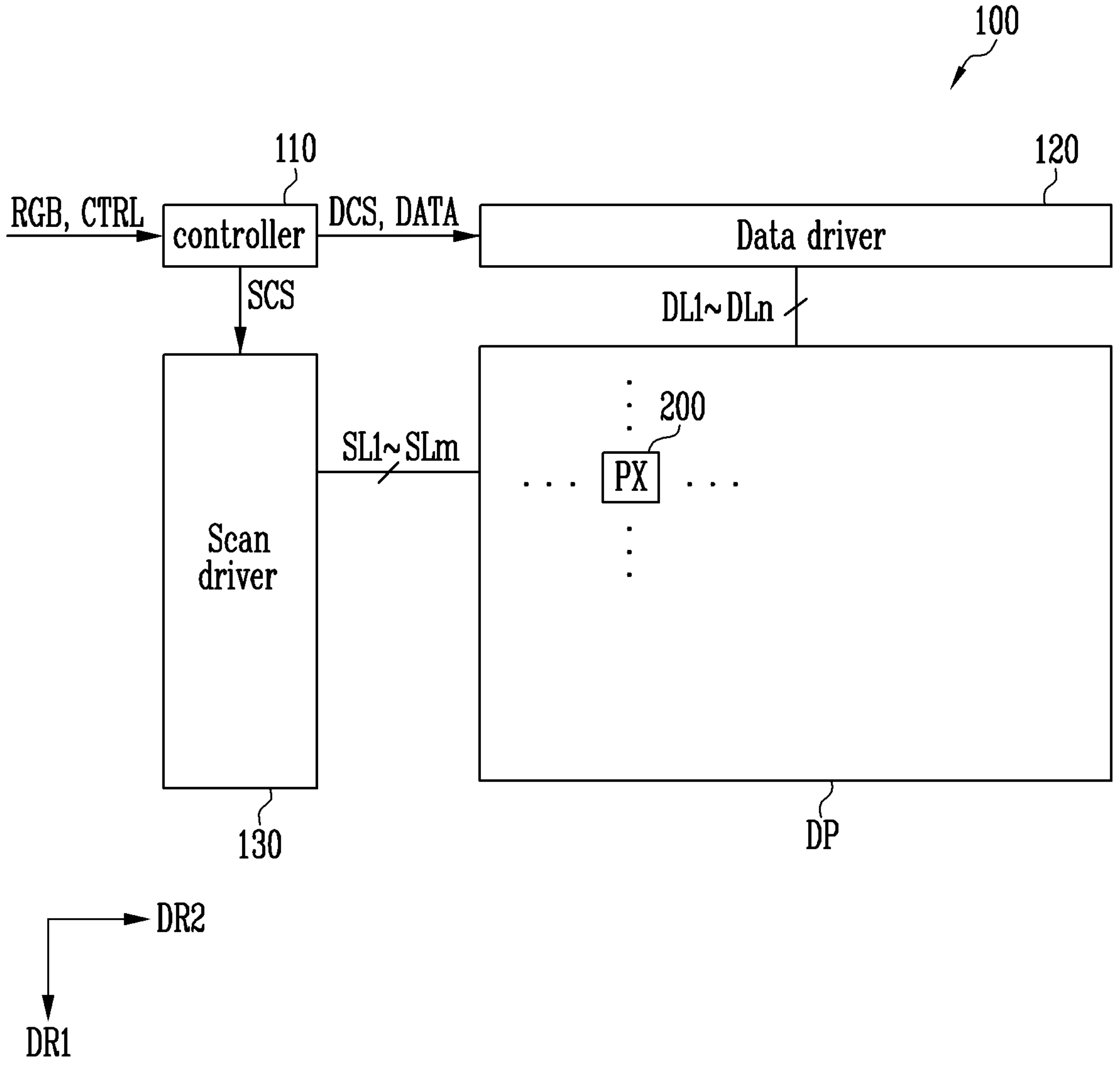
FIG. 1 is a block diagram illustrating a display device in accordance with an embodiment of the present disclosure.

FIG. 1 is a block diagram illustrating a display device in accordance with an embodiment of the present disclosure.

Referring to FIG. 1, the display device 100 may include a display panel DP, a controller 110, a data driver 120, and a scan driver 130.

The controller 110 may control driving operations of the data driver 120 and the scan driver 130. The controller 110 may receive an image signal RGB and a control signal CTRL. The controller 110 may start scanning according to a timing implemented in each frame and to generate an image data signal DATA obtained by converting a data format of the image signal RGB to be suitable for interface specifications with the data driver 120. The controller 110 may output a first control signal SCS and a second control signal DCS.

The controller 110 may be a timing controller used in ordinary display technologies or a control device which includes the timing controller to further perform another control function. The controller 110 may be implemented as a component separate from the data driver 120. The controller 110 and the data driver 120 may be implemented as one integrated circuit.

The display panel DP may include a plurality of unit pixels PX. The plurality of unit pixels PX may be arranged in a first direction DR1 and a second direction DR2. In addition, a plurality of scan lines SL1 to SLm and a plurality of data lines DL1 to DLm may be disposed in the display panel DP. Therefore, the plurality of scan lines SL1 to SLm and the plurality of data lines DL1 to DLm may be disposed while intersecting each other. In the display panel DP, the plurality of unit pixels PX are electrically connected to the scan lines SL1 to SLm and the data lines DL1 to DLm.

The display panel DP may include various types of panels such as an Organic Light Emitting Diode (OLED). The kinds of lines disposed in the display panel DP may vary according to a sub-pixel structure, a panel type, or the like.

The data driver 120 may output a data voltage to the plurality of data lines DL1 to DLm, thereby driving the plurality of data lines DL1 to DLm. For example, the data driver 120 may receive the second control signal DCS and the image data signal DATA from the controller 110. The data driver 120 may convert the image data signal DATA into data signals, and output the data signals to the data lines DL1 to DLn. The data signals may be analog voltage values corresponding to grayscale values of the image data signal DATA. That is, when a specific scan line is selected by the scan driver 130, the data driver 120 may convert the received image data signal DATA into a data voltage in an analog form and supply the data voltage to the plurality of data lines DL1 to DLm.

The scan driver 130 may output a scan signal to the plurality of scan lines SL1 to SLm, thereby driving the plurality of scan lines SL1 to SLm. The scan driver 130 may mean a gate driver. The scan driver 130 may sequentially supply the scan signal having an on-voltage and an off-voltage to the plurality of scan lines SL1 to SLm under the control of the controller 110. For example, the scan driver 130 may receive the first control signal SCS from the controller 110. The first control signal SCS may include a start signal and clock signals. The scan driver 130 may output scan signals to the scan lines SL1 to SLm in response to the first control signal SCS.

Therefore, unit pixels PX receiving each scan signal may receive analog voltages of grayscale values corresponding to the image data signal DATA. Accordingly, the unit pixels PX can output light with a luminance corresponding to the analog voltages. Thus, an image can be displayed on the display panel DP.

Figure 2:
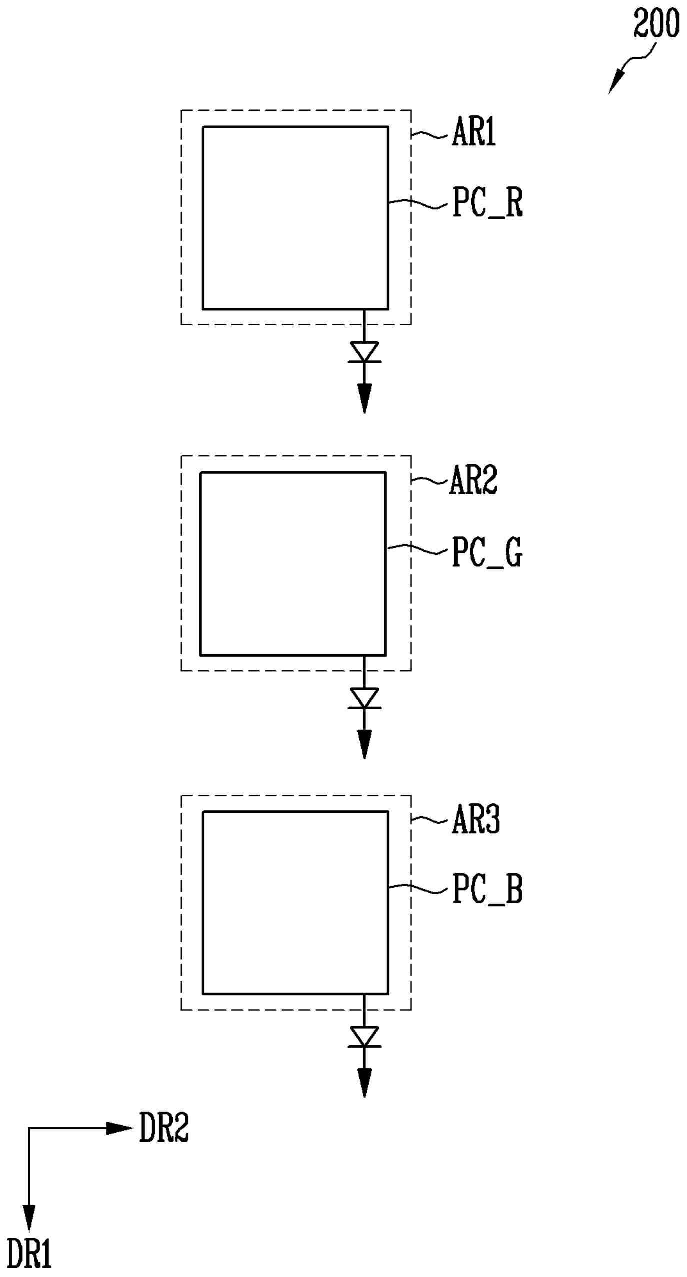
FIG. 2 is a block diagram illustrating an embodiment of pixel circuit areas included in at least one unit pixel shown in FIG. 1.

FIG. 2 is a block diagram illustrating an embodiment of pixel circuit areas included in at least one unit pixel shown in FIG. 1.

Referring to FIG. 2, at least one unit pixel 200 may include a plurality of sub-pixels.

In accordance with an embodiment, the one unit pixel 200 may include red (R), green (G), and blue (B) sub-pixels. Alternatively, the one unit pixel 200 may further include a white (W) sub-pixel in addition to the red, green, and blue sub-pixels. In FIG. 2, for convenience of description, three pixel circuits PC_R, PC_G, and PC_B disposed subsequently are illustrated. However, the embodiments are not limited thereto. For example, the present disclosure may also be applied to two pixel circuits disposed sequentially.

Each of the sub-pixels may include a pixel circuit and a light emitting element. For example, the red sub-pixel may include a first pixel circuit PC_R and a light emitting element controlled by the first pixel circuit PC_R to emit light.

Pixel circuit areas AR1, AR2, and AR3 may have the same area, and be sequentially arranged in the first direction DR1 on a substrate. In addition, pixel circuits which drive the sub-pixels included in the one unit pixel may be disposed in the pixel circuit areas AR1, AR2, and AR3, respectively. For example, the first pixel circuit PC_R of the red sub-pixel may be disposed in a first pixel circuit area AR1 among the pixel circuit areas arranged in the first direction DR1. A second pixel circuit PC_G of the green sub-pixel may be disposed in a second pixel circuit area AR2 among the circuit areas arranged in the first direction DR1. A third pixel circuit PC_B of the blue sub-pixel may be disposed in a third pixel circuit area AR3 among the circuit areas arranged in the first direction DR1. However, the order of red, green, and blue subpixels is described as an example, and the present disclosure is not limited thereto.

Figure 3:
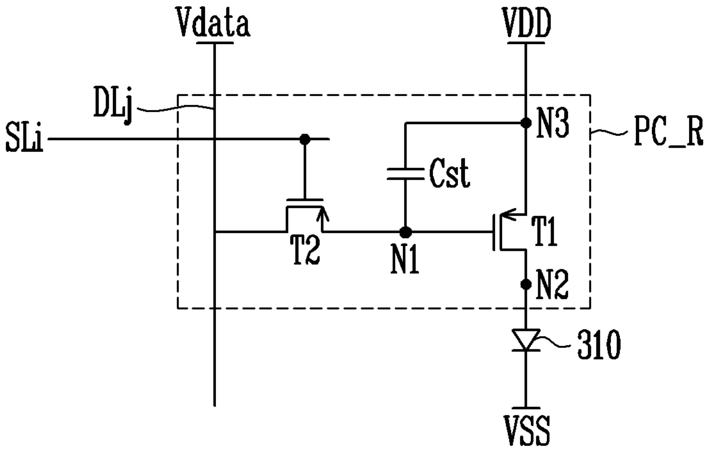
FIG. 3 is a circuit diagram illustrating an embodiment of a pixel circuit shown in FIG. 2.

FIG. 3 is a circuit diagram illustrating an embodiment of the pixel circuit shown in FIG. 2.

Referring to FIG. 3, pixel circuits of sub-pixels of one unit pixel among the plurality of unit pixels PX shown in FIG. 1 will be described.

A pixel circuit of each of the sub-pixels may have a 2T1C structure including two Transistors and one capacitor. In particular, as a micro organic light emitting display device requires a pixel circuit having a structure including a minimum number of transistors and a minimum number of capacitors for the purpose of 4K pixel design, the micro organic light emitting display device may be configured with a pixel circuit having the 2T1C structure. The pixel circuit having the 2T1C structure may include a first transistor, a second transistor, and a capacitor. The first transistor may be a driving transistor T1, the second transistor may be a switching transistor T2, and the capacitor may be a storage capacitor Cst.

The driving transistor T1 may drive a light emitting element 310 by supplying a driving current. A gate electrode of the driving transistor T1 may be electrically connected to a first node N1. In addition, a drain electrode of the driving transistor T1 may be electrically connected to a second node N2 which is electrically connected to an anode electrode of the light emitting element 310. A source electrode of the driving transistor T1 may be electrically connected to a third node N3 which is connected to a power voltage VDD.

The switching transistor T2 may be connected between the first node N1 and a corresponding data line DLj. A gate electrode of the switching transistor T2 may be electrically connected to a scan line SLi for supplying a scan signal. A drain electrode of the switching transistor T2 may be electrically connected to the data line DLj, and a source electrode of the switching transistor T2 may be electrically connected to the first node N1.

On/off of the switching transistor T2 may be controlled by the scan signal applied to the gate electrode through the scan line SLi. When the switching transistor T2 is turned on by the scan signal, the switching transistor T2 may transfer a data voltage Vdata supplied from the corresponding scan line SLi to the gate electrode of the driving transistor T1. However, in the present disclosure, a case where each of the driving transistor T1 and the switching transistor T2 is a p-type transistor is described as an example. However, each of the driving transistor T1 and the switching transistor T2 may be an n-type transistor, or the driving transistor T1 and the switching transistor T2 may be transistors of different types.

The storage capacitor Cst may serve to maintain a constant voltage for a certain time (e.g., one frame time). The storage capacitor Cst may be electrically connected between the first node N1 and the third node N3 or be electrically connected between the first node N1 and the second node N2. However, in the present disclosure, a case where the storage capacitor Cst is connected between the first node N1 and the third node N3 is described as an example. However, the present disclosure is not limited thereto.

The storage capacitor Cst is not a parasitic capacitor (e.g., Cgs or Cgd) as an internal capacitor existing between the source, drain, and gate electrodes of the driving transistor T1, but may be an external capacitor intentionally designed at the outside of the driving transistor T1.

The light emitting element 310 may include an organic light emitting diode (OLED). The anode electrode of the light emitting element 310 may correspond to a pixel electrode, and another power voltage VSS corresponding to a common voltage may be applied to a cathode electrode of the light emitting element 310. The base voltage VSS may be a ground voltage or a voltage higher or lower than the ground voltage. Also, the base voltage VSS may vary according to a driving state such as image driving or sensing driving.

Referring to FIG. 3, the pixel circuit PC_R of the red sub-pixel may be a pixel circuit of a sub-pixel disposed on an ith row and a jth column among the sub-pixels (i is a positive integer smaller than or equal to m and j is a positive integer smaller than or equal to n). For example, the pixel circuit PC_R may be a pixel circuit of a red sub-pixel included in one unit pixel. The pixel circuit PC_R may be connected to an ith scan line SLi and a jth data line DLj to control the light emitting element 310 to emit light in response to signals received through the ith scan line SLi and the jth data line DLj.

Hereinafter, a plurality of conductive layers included in the pixel circuit areas AR1 to AR3 shown in FIG. 2 will be described with reference to FIGS. 4 to 8. The display panel DP may include a substrate SUB, a first conductive layer 400, a fifth conductive layer 500, a second conductive layer 600, a third conductive layer 700, and a fourth conductive layer 800 sequentially disposed on the substrate SUB. Although not shown in FIGS. 4 to 8, each conductive layer may include a plurality of conductive layers. At least one insulating layer is disposed between adjacent conductive layers to insulate the adjacent conductive layers. For example, each of the conductive layers may be formed in a single-layer or multi-layer structure made of any one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), or any alloy thereof. In addition, each of the insulating layers may be formed in a single-layer or multi-layer structure made of an inorganic layer including silicon oxide ($SiO_x$), silicon nitride ($SiN_x$), and silicon oxynitride (SiON). However, this is merely illustrative, and the present disclosure is not limited thereto.

Figure 4:
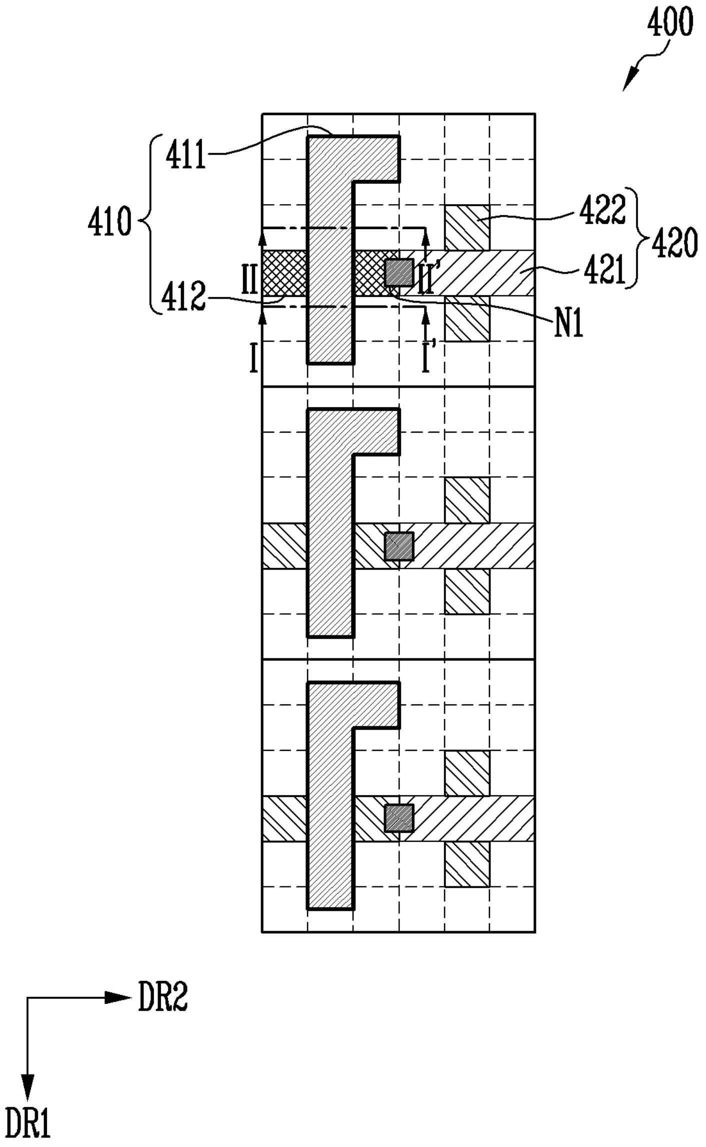
FIG. 4 is a plan view illustrating an embodiment of a first conductive layer in the pixel circuit shown in FIG. 2.

FIG. 4 is a plan view illustrating an embodiment of a first conductive layer in the pixel circuit shown in FIG. 2. Referring to FIG. 4, the first conductive layer 400 disposed on the substrate will be described. The substrate is an insulating substrate, and may be a rigid substrate or a flexible substrate which is made of an insulating material such as glass, quartz or polymer resin. Pixel circuits which drive a plurality of sub-pixels may include a plurality of conductive layers disposed on the substrate.

The first conductive layer 400 may be disposed on the substrate SUB, and include a plurality of conductive layers. At least one insulating layer is disposed between the plurality of conductive layers included in the first conductive layer 400. The at least one insulating layer may insulate the plurality of conductive layers disposed in the first conductive layer 400.

Referring to FIGS. 3 and 4, the first conductive layer 400 may include gate electrodes respectively disposed in pixel circuit areas arranged in the first direction DR1. In an example, the first conductive layer 400 may include gate electrodes, source/drain electrodes of a plurality of driving transistors T1 420 and a plurality of switching transistors T2 410 which are disposed in the pixel circuit areas. A first insulating layer 110 may be disposed on the gate electrode and the source/drain electrodes to electrically insulate the gate electrodes and the source/drain electrodes from each other. For example, a first insulating layer 110 may be disposed over the gate electrodes 421 of the driving transistors T1, and the source and drain electrodes 422 of the driving transistors T1 may be disposed on the first insulating layer 110. The gate electrodes 411 of the switching transistors T2, the first insulating layer, and the source/drain electrodes 412 of the switching transistors T2 may be sequentially disposed on the substrate SUB. However, this describes an example of an order in which the plurality of layers included in the first conductive layer 400 are disposed, and the present disclosure is not limited thereto.

The gate electrodes 421 of the driving transistors T1 included in the first conductive layer 400 may overlap with the source electrodes 412 of the switching transistors T2 at the first node N1. The gate electrodes 421 of the driving transistors T1 and the gate electrodes 411 of the switching transistors T2 may be spaced apart from each other. The gate electrodes 421 of the driving transistors T1 may extend in the second direction DR2, and the gate electrodes 411 of the switching transistors T2 may extend in the first direction DR1.

Figure 5:
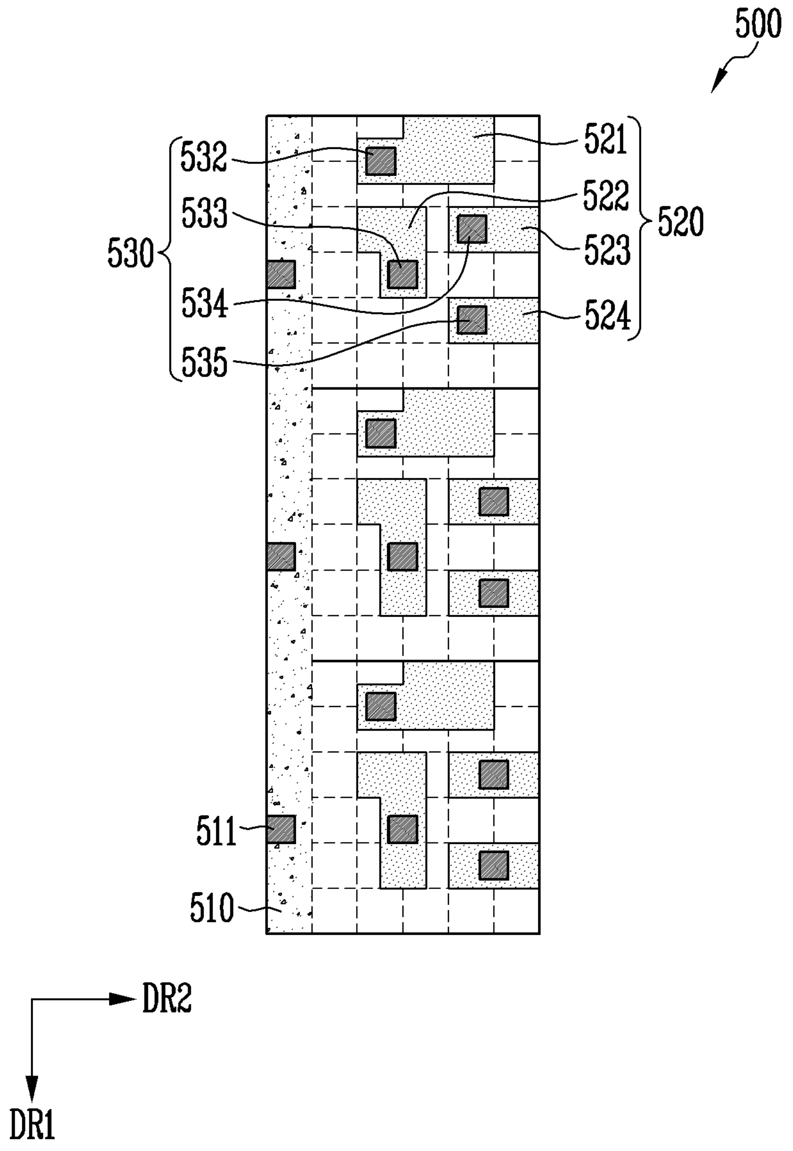
FIG. 5 is a plan view illustrating an embodiment of a fifth conductive layer in the pixel circuit shown in FIG. 2.

FIG. 5 is a plan view illustrating an embodiment of a fifth conductive layer in the pixel circuit shown in FIG. 2. Referring to the fifth conductive layer 500 disposed on the substrate will be described.

The fifth conductive layer 500 may be disposed on the first conductive layer 400, and include data lines 510 and third bridge patterns 520. Also, the fifth conductive layer 500 may be electrically connected to the first conductive layer 400 through contact holes 530 formed in the first insulating layer 110 disposed between the first conductive layer 400 and the fifth conductive layer 500.

The data lines 510 included in the fifth conductive layer 500 may supply a data signal to the switching transistors T2 of the sub-pixels included in the one unit pixel. The data lines 510 may be electrically connected to the drain electrodes 412 of the switching transistors T2 of the first conductive layer 400 through contact holes 511 formed in the first insulating layer 110 on the first conductive layer 400. For example, the data lines 510 included in the fifth conductive layer 500 may be disposed to overlap with the drain electrodes (or source electrodes) 412 of the switching transistors T2 included in the first conductive layer 400. More specifically, the data lines 510 may be disposed to extend in the first direction DR1 from one sides in the respective sub-pixels. Also, the contact holes 511 may be formed in areas at which the data lines 510 overlap with corresponding drain electrodes 412 of the switching transistors T2 in the respective sub-pixels.

A gate signal supplied from the second conductive layer 600 may be supplied to the switching transistors T2 through bridge patterns 521 among the third bridge patterns 520 included in the fifth conductive layer 500. For example, the some bridge patterns 521 among the third bridge patterns 520 included in the fifth conductive layer 500 may be disposed to overlap with the gate electrodes 411 of the switching transistors T2 included in the first conductive layer 400. The bridge patterns 521 may be connected to the gate electrodes of the switching transistors T2 through contact holes 532 formed in a first insulating layer 110 which is disposed on the first conductive layer 400.

Some bridge patterns 522 among the third bridge patterns 520 may be disposed to overlap with the gate electrodes 421 of the driving transistors T1 included in the first conductive layer 400. The bridge patterns 522 may be connected to the gate electrodes 421 of the driving transistors T1 through contact holes 533 formed in the first insulating layer 110 disposed between the first conductive layer 400 and the second conductive layer 500.

In addition, some bridge patterns 523 and 524 among the third bridge patterns 520 may be disposed to respectively overlap with the source and drain electrodes 422 of the driving transistors T1. In particular, the bridge patterns 524 may correspond to one of bridge patterns for connecting the drain electrodes of the driving transistors T1 to anode electrodes. For example, some bridge patterns 524 among the third bridge patterns 520 may overlap with and connected to the drain electrodes of the driving transistors T1 included in the first conductive layer 400. The bridge patterns 524 may connect the drain electrodes of the driving transistors T1 to the anode electrodes of the respective sub-pixels through the contact holes 535.

The bridge patterns 520 may be conductive patterns for connecting different layers to each other. Also, the bridge patterns 520 may be disposed between interlayer insulating layers and be electrically connected to electrodes or bridge patterns which are included in different conductive layers through contact holes formed through the interlayer insulating layer. Accordingly, the bridge patterns 520 may be disposed to be spaced apart from each other.

Figure 6:
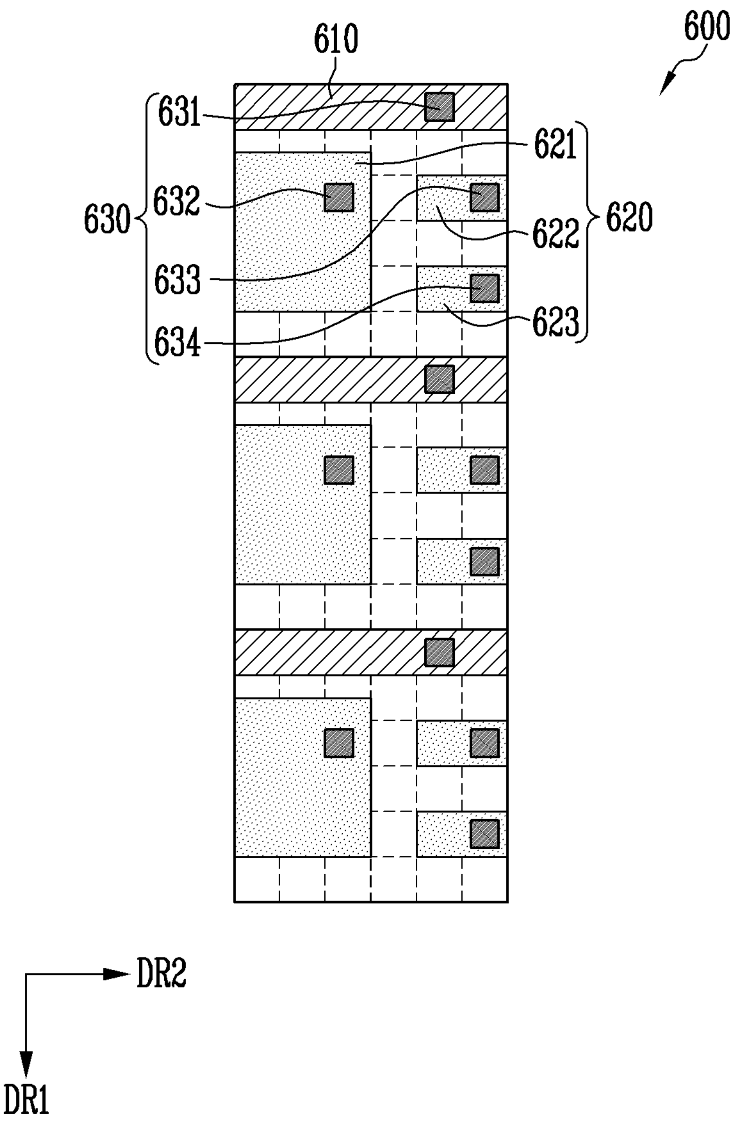
FIG. 6 is a plan view illustrating an embodiment of a second conductive layer in the pixel circuit shown in FIG. 2.

FIG. 6 is a plan view illustrating an embodiment of a second conductive layer in the pixel circuit shown in FIG. 2. Referring to FIG. 6, the second conductive layer 600 disposed on the substrate will be described.

The second conductive layer 600 may be disposed on the fifth conductive layer 500 and include gate lines 610 and first bridge patterns 620. The second conductive layer 600 may be electrically connected to the fifth conductive layer 500 through contact holes 630 respectively formed in a second insulating layer 120 disposed on the fifth conductive layer 500.

The gate lines 610 included in the second conductive layer 600 may supply a gate signal to the switching transistors T2 of the sub-pixels included in the one unit pixel. The gate lines 610 may be electrically connected to the gate electrodes 411 of the switching transistors T2 of the first conductive layer 400 through contact holes 631 formed in the second insulating layer 120 disposed on the fifth conductive layer 500. For example, the contact holes 631 may expose the bridge patterns 521 of the fifth conductive layer 500. More specifically, the gate lines 610 may be disposed to extend in the second direction DR2 from one sides in the respective sub-pixels. Also, the gate lines 610 may be electrically connected to the bridge patterns 521 included in the fifth conductive layer 500 through the contact holes 631. Also, the gate lines 610 may be connected to the gate electrodes 411 of the switching transistors T2 through the contact holes 532 formed in the second insulating layer 120. Therefore, the gate signal may be supplied to an end connected to the gate electrodes 411 of the switching transistors T2 through the gate lines 610.

The first bridge patterns 620 included in the second conductive layer 600 may be connected to the gate electrodes 421 and the source and drain electrodes 422 of the driving transistors T1 through contact holes 632, 633, and 634 formed in the second insulating layer 120 disposed on the fifth conductive layer 500, respectively. For example, some bridge patterns 621 among the first bridge patterns 620 included in the second conductive layer 600 may overlap with the bridge patterns 522 of the second conductive layer 500. The bridge patterns 621 may be connected to the bridge patterns 522 of the second conductive layer 500 through the contact holes 632, and be connected to the gate electrodes of the driving transistors T1 through the contact holes 533 formed in the first insulating layer disposed on the first conductive layer 400.

In addition, some bridge patterns 622 among the first bridge patterns 620 may overlap the bridge patterns 523 of the fifth conductive layer 500. The bridge patterns 622 may be connected to the bridge patterns 523 of the fifth conductive layer 500 through the contact holes 633, and be connected to the source electrodes of the driving transistors T1 through the contact holes 534 formed in the first insulating layer 110 disposed on the first conductive layer 400.

Some bridge patterns 623 among the first bridge patterns 620 may correspond to one of bridge patterns for connecting the drain electrodes of the driving transistors T1 to the anode electrodes. For example, the bridge patterns 623 may overlap the bridge pattern 524 of the fifth conductive layer 500. The bridge patterns 623 of the second conductive layer 600 may be connected to the bridge patterns 524 of the fifth conductive layer 500 through the contact holes 634. That is, the bridge patterns 623 are connected to the bridge patterns 524 to be connected to the drain electrodes of the driving transistors T1.

The bridge patterns 620 may be conductive patterns for connecting different layers to each other. Also, the bridge patterns 620 may be disposed on an interlayer insulating layer and be electrically connected to electrodes or bridge patterns which are included in different conductive layers through contact holes formed through the interlayer insulating layer. Accordingly, the bridge patterns 620 may be disposed to be spaced apart from each other.

Figure 7:
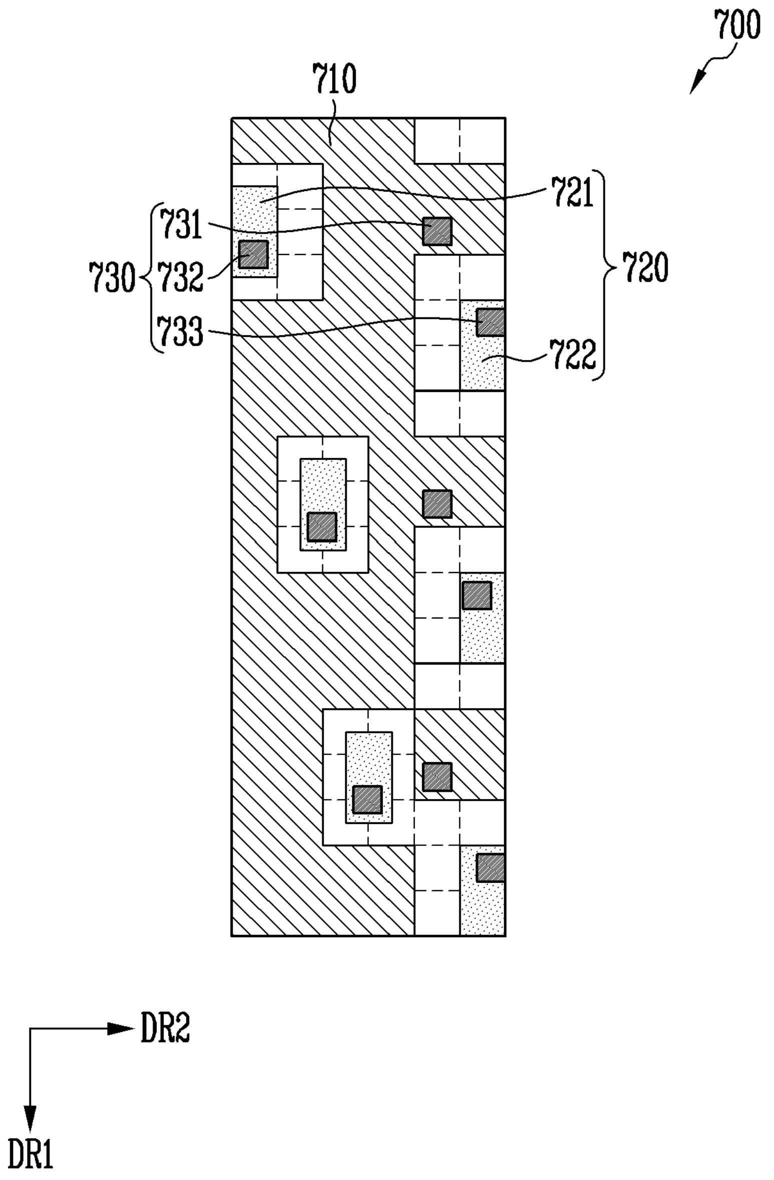
FIG. 7 is a plan view illustrating an embodiment of a third conductive layer in the pixel circuit shown in FIG. 2.

FIG. 7 is a plan view illustrating an embodiment of a third conductive layer in the pixel circuit shown in FIG. 2. Referring to FIG. 7, the third conductive layer 700 disposed on the substrate will be described.

The third conductive layer 700 may be disposed on the second conductive layer 600, and include a voltage supply line 710 and second bridge patterns 720. The third conductive layer 700 may electrically connect the second conductive layer 600 and the fourth conductive layer 800 to each other through contact holes formed in a third insulating layer 130 disposed between the second conductive layer 600 and the third conductive layer 700, and a fourth insulating layer 140 disposed between the third conductive layer 700 and the fourth conductive layer 800. Also, the third conductive layer 700 may form a storage capacitor with the second conductive layer 600 overlapped with the third conductive layer 700 in a plan view.

The voltage supply line 710 included in the third conductive layer 700 may supply a power voltage VDD to the driving transistors T1 of the sub-pixels included in the one unit pixel. The voltage supply line 710 may extend in the first direction DR1 to overlap with the pixel circuit areas. The pixel circuit areas may be areas in which the pixel circuits of the sub-pixels included in the one unit pixel are disposed. That is, the voltage supply line 710 may be formed in one conductive pattern to supply the same power voltage VDD to the sub-pixels included in the one unit pixel.

The voltage supply line 710 may be electrically connected to the source electrodes of the driving transistors T1 of the first conductive layer 400 through contact holes 731 formed in the third insulating layer 130 disposed on the second conductive layer 600. For example, the third insulating layer 130 on which the voltage supply line 710 is disposed may include the contact holes 731 exposing the bridge patterns 622 of the second conductive layer 600. More specifically, the voltage supply line 710 may be connected to the bridge patterns 622 included in the second conductive layer 600 through the contact holes 731. Also, the voltage supply line 710 may be connected to the bridge patterns 523 of the fifth conductive layer 500 through the contact holes 633 formed in the second insulating layer 120 disposed on the fifth conductive layer 500. The voltage supply line 710 connected to the bridge patterns 523 may be connected to the source electrodes of the driving transistors T1 through the contact holes 534. That is, the voltage supply line 710 and the source electrodes of the driving transistors T1 may be electrically connected to each other through a plurality of bridge patterns.

The second bridge patterns 720 included in the third conductive layer 710 may be connected to some patterns 621 and 623 among the first bridge pattern 620 through second contact holes 732 and 733 formed in the third insulating layer, respectively. For example, some bridge patterns 721 among the second bridge patterns 720 included in the third conductive layer 700 may overlap the bridge patterns 621 of the second conductive layer 600. The bridge patterns 721 may be connected to the bridge patterns 621 of the second conductive layer 600 through the contact holes 732 and then be connected to the bridge patterns 522 of the fifth conductive layer 500 through the contact holes 632. The bridge patterns 522 are patterns connected to the gate electrodes of the driving transistors T1, and the bridge patterns 721 may be connected to the gate electrodes of the driving transistors T1.

Some bridge patterns 722 among the second bridge patterns 720 may correspond to one of the bridge patterns for connecting the drain electrodes of the driving transistors T1 to the anode electrodes. For example, the bridge patterns 722 may include contact holes 733 exposing the bridge patterns 623 of the second conductive layer 600. The bridge patterns 722 may be connected to the bridge patterns 623 of the second conductive layer 600 through the contact holes 733 and then be connected to the bridge patterns 524 of the fifth conductive layer 500 through the contact holes 634. The bridge patterns 524 are patterns connected to the drain electrodes of the driving transistors T1, and the bridge patterns 722 may be connected to the drain electrodes of the driving transistors T1.

The bridge patterns 720 may be conductive patterns for connecting different layers to each other. Also, the bridge patterns 720 may be disposed on an interlayer insulating layer and be electrically connected to electrodes or bridge patterns which are included in different conductive layers through contact holes formed through the interlayer insulating layer. Accordingly, the bridge patterns 720 may be disposed to be spaced apart from each other.

Figure 8:
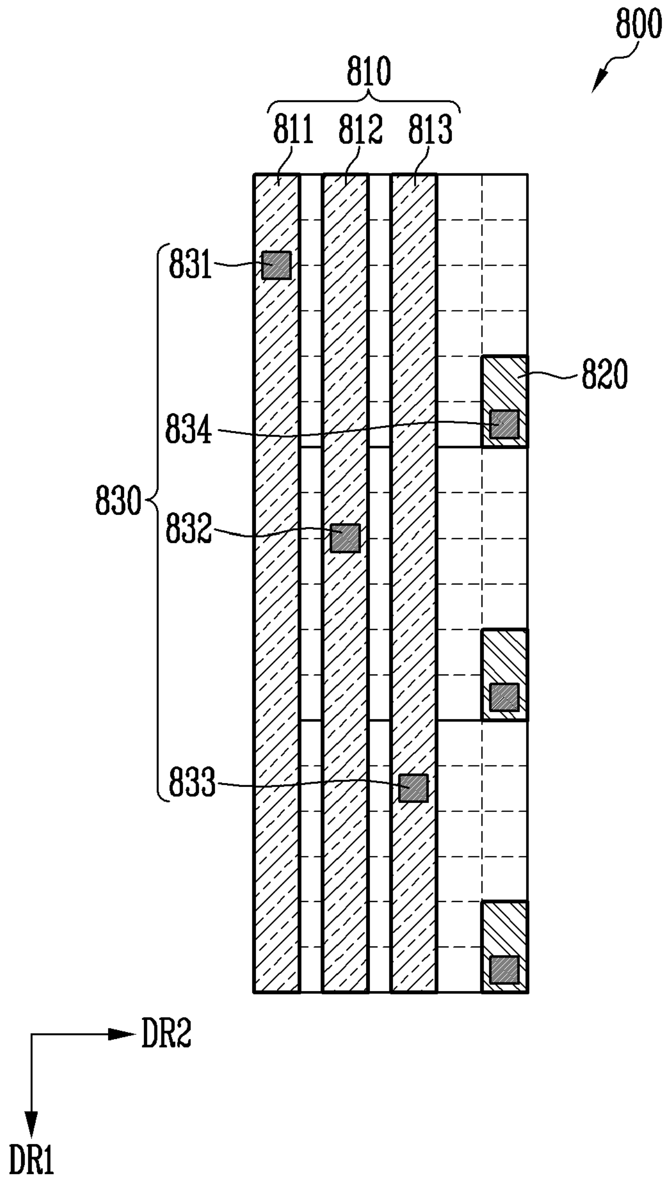
FIG. 8 is a plan view illustrating an embodiment of a fourth conductive layer in the pixel circuit shown in FIG. 2.

FIG. 8 is a plan view illustrating an embodiment of a fourth conductive layer in the pixel circuit shown in FIG. 2. Referring to FIG. 8, the fourth conductive layer 800 disposed on the substrate will be described.

The fourth conductive layer 800 may be disposed on the third conductive layer 700, and include common electrode lines 810. The fourth conductive layer 800 may include the common electrode lines 810 which are electrically connected to the gate electrodes through the first bridge patterns 620 and the second bridge patterns 720 and are electrically separated from the voltage supply line 710. The common electrode line 810 is a line commonly connected to the gate electrode of the transistor T1 of each unit pixel, and does not mean a line to which another power voltage (VSS) is applied.

The common electrode lines 810 may be arranged in the second direction DR2 intersecting the first direction DR1, and each of the common electrode lines 810 may extend in the first direction DR1 to overlap with the pixel circuit areas. The common electrode lines 810 may be spaced apart from each other in the second direction DR2 in which the common electrode lines 810 are arranged. For example, when a red sub-pixel, a green sub-pixel, and a blue sub-pixel, which are included in the one unit pixel, are sequentially disposed in the first direction DR1, each of the common electrode lines 810 may have a bar-shaped pattern extending in the first direction DR1 from the red sub-pixel to the blue sub-pixel.

A number of the common electrode lines 810 may be equal to a number of the sub-pixels included in the one unit pixel. For example, the common electrode lines 810 may be formed by a number of the sub-pixels included in the one unit pixel to be connected to the respective gate electrodes included in the pixel circuits of the sub-pixels. More specifically, when a red sub-pixel, a green sub-pixel, and a blue sub-pixel are included in one unit pixel, the fourth conductive layer 800 may include a first common electrode line 811 connected to a gate electrode of a driving transistor T1 included in a pixel circuit of the red sub-pixel, a second common electrode line 812 connected to a gate electrode of a driving transistor T1 included in a pixel circuit of the green sub-pixel, and a third common electrode line 813 connected to a gate electrode of a driving transistor T1 included in a pixel circuit included in the blue sub-pixel.

The common electrode lines 810 may be electrically connected to the gate electrodes of the driving transistors T1 through the second bridge patterns 721, the first bridge patterns 621, and the third bridge patterns 522. A fourth insulating layer 140 is disposed on the third conductive layer 700. The fourth insulating layer 140 may include first contact holes 831, 832, and 833 exposing a pixel circuit area of corresponding sub-pixels. Each of the common electrode lines 810 may be connected to the second bridge patterns through the first contact holes 831, 832, and 833 formed in the fourth insulating layer 140, and be connected to the gate electrodes of the corresponding sub-pixel via the second bridge patterns and the first bridge patterns which overlap with each other. For example, the first common electrode line 811 may be electrically connected to the second bridge patterns 721 of the third conductive layer 700 through one first contact hole 831 in the pixel circuit area of the red sub-pixel. The first common electrode line 811 may be electrically connected to gate electrodes of driving transistors T1 for driving the red sub-pixel via the first bridge patterns 621 of the second conductive layer 600 and the bridge patterns 522 of the fifth conductive layer 500. The second common electrode line 812 may be connected to second bridge patterns through one first contact hole 832 in the pixel circuit area of the green sub-pixel, and be connected to gate electrodes of driving transistors T1 for driving the green sub-pixel via second bridge patterns and first bridge patterns. In addition, the third common electrode line 813 may be connected to second bridge patterns through one first contact hole 833 in the pixel circuit area of the blue sub-pixel, and be connected to gate electrodes of driving transistors T1 for driving the blue sub-pixel via second bridge patterns and first bridge patterns.

On the other hand, since the fourth insulating layer 140 does not include any contact hole in an area except a pixel circuit area of a corresponding sub-pixel, each of the common electrode lines 810 may be electrically separated from the third conductive layer 700. For example, the fourth insulating layer 140 disposed under the first common electrode line 811 includes one first contact hole 831 in the pixel circuit area of the red sub-pixel, but may not include any contact hole in the pixel circuit area of the green sub-pixel and the pixel circuit area of the blue sub-pixel. Therefore, the first common electrode line 811 may be disposed on the voltage supply line 710 of the third conductive layer 700 and be electrically separated from the voltage supply line 710 in the area except the pixel circuit area of the red sub-pixel.

Accordingly, the common electrode lines 810 and the voltage supply line 710 overlapping each other with the fourth insulating layer 140 interposed therebetween may form a first storage capacitor. The common electrode lines 810 are not electrically connected the voltage supply line 710 overlapping with the pixel circuit areas included in the one unit pixel but separated from the voltage supply line 710, thereby forming a storage capacitor between the common electrode lines 810 and the voltage supply line 710. The storage capacitor will be described in detail later with reference to FIGS. 9 and 10.

Fourth bridge patterns 820 may correspond to one of the bridge patterns for connecting the drain electrodes of the driving transistors T1 to the anode electrodes. Referring to FIGS. 3 and 8, the fourth bridge patterns 820 may correspond to the second node N2 connected to the anode electrode. The fourth bridge patterns 820 may be connected to the drain electrodes of the driving transistors T1 via the bridge patterns 722 of the third conductive layer 700, the bridge patterns 623 of the second conductive layer 600, and the bridge patterns 524 of the fifth conductive layer 500. The drain electrode of the driving transistor T1 may be electrically connected to the anode electrode of the organic light emitting diode through the corresponding path. Although not shown in FIGS. 4 to 8, other lines and other patterns may be further disposed in the pixel circuits of the sub-pixels included in the one unit pixel.

Figure 9:
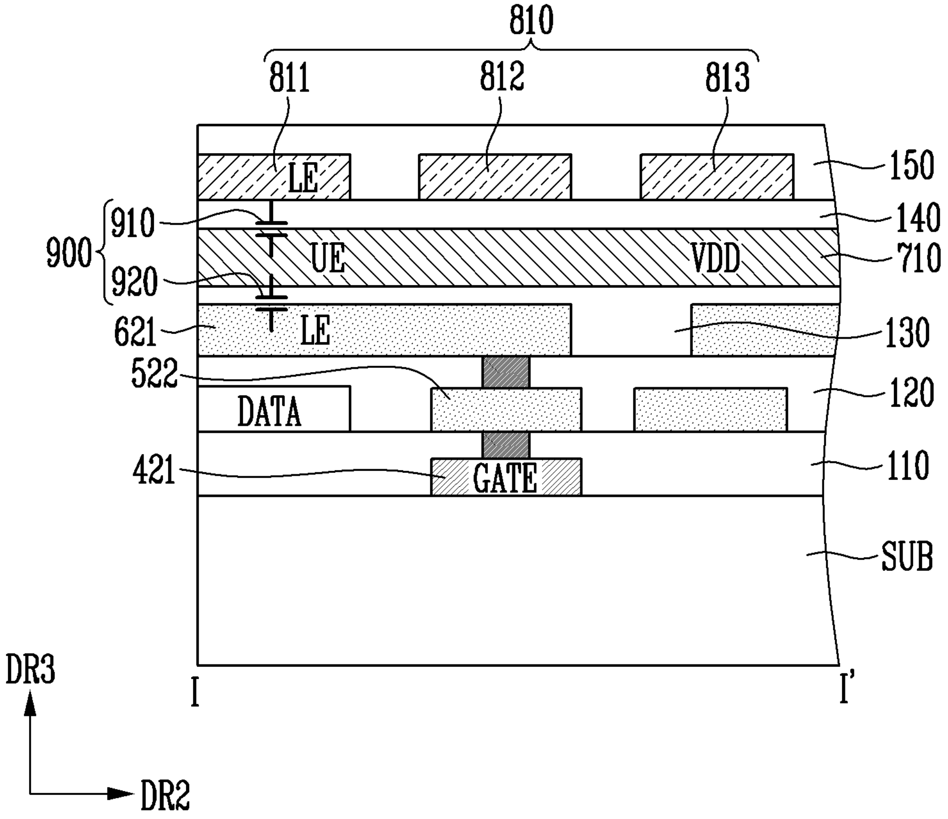
FIG. 9 is a sectional view illustrating a pixel circuit including first to fifth conductive layers, taken along line I-I' shown in FIG. 4.

FIG. 9 is a sectional view illustrating a pixel circuit including first to fifth conductive layers taken along line I-I' shown in FIG. 4. Referring to FIG. 9, an example of a storage capacitor 900 connected between the voltage supply line 710 and the first node N1 will be described. The storage capacitor 900 may store a voltage corresponding to a data signal, and include a lower electrode LE and an upper electrode UE.

Referring to FIGS. 4 and 9, the storage capacitor 900 may be formed between the second conductive layer 621 connected to the gate electrode 421 of the driving transistor T1, which is connected to the first node N1, and the voltage supply line 710. The second conductive layer 621 connected to the gate electrode 421 of the driving transistor T1 along the voltage supply line 710 may form the storage capacitor 900 with the third insulating layer 130 interposed therebetween. The lower electrode LE of the storage capacitor 900 may be formed with the second conductive layer 621 connected to the gate electrode 421 of the driving transistor T1, and the upper electrode UE of the storage capacitor 900 may be formed with the voltage supply line 710. For example, in the red sub-pixel included in the one unit pixel, the second conductive layer 621 forming the lower electrode LE may be connected to the gate electrode 421 of the driving transistor T1 for driving the red sub-pixel. In addition, the voltage supply line 710 of the third conductive layer 700, which forms the upper electrode UE, may be one conductive pattern which extends in the first direction DR1 and is widely disposed to be shared by sub-pixels. Accordingly, the sub-pixels included in the one unit pixel share the voltage supply line 710, so that an overlapping area of the upper electrode UE and the lower electrode LE can increase, thereby increasing a capacitance of the storage capacitor 900.

Referring to FIG. 9, the storage capacitor 900 may form a first storage capacitor 910 and a second storage capacitor 920 with respect to the voltage supply line 710 of the third conductive layer 700, thereby forming a cavity structure. The first storage capacitor 910 may be formed by each of the common electrode lines 810 and the voltage supply line 710. In addition, the second storage capacitor 920 may be formed by the first bridge patterns 621 included in the second conductive layer 600 and the voltage supply line 710 of the third conductive layer 700.

For example, in the red sub-pixel included in the one unit pixel, a lower electrode LE of the first storage capacitor 910 may be connected to the gate electrode 421 of the driving transistors T1 for driving the red sub-pixel via the third bridge patterns 522 of the fifth conductive layer 500, the first bridge patterns 621 of the second conductive layer 600, and the second bridge patterns 721 of the third conductive layer 700, and be formed in the second conductive layer 600.

In addition, a lower electrode LE of the second storage capacitor 920 may be connected to the gate electrodes 421 of the driving transistors T1 for driving the red sub-pixel via the third bridge patterns 522 of the fifth conductive layer 500, and be formed in the first bridge patterns 621 of the second conductive layer 600.

On the other hand, upper electrodes UE of the first storage capacitor 910 and the second storage capacitor 920 may be formed in the voltage supply line 710 of the third conductive layer 700. Thus, the storage capacitor 900 forms the first storage capacitor 910 and the second storage capacitor 920, which are connected in parallel between the gate electrode 421 of the driving transistor T1 and the voltage supply line 710, so that the capacitance of the storage capacitor 900 can be further increased.

Figure 10:
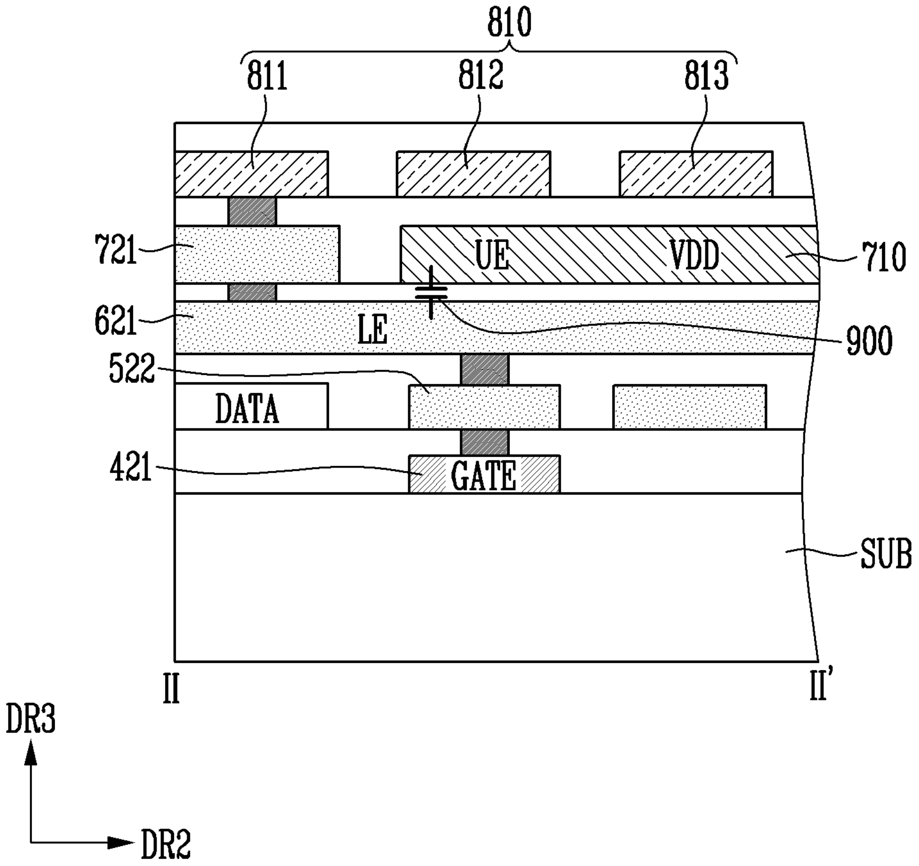
FIG. 10 is a sectional view illustrating a pixel circuit including first to fifth conductive layers, taken along line II-II' shown in FIG. 4.

FIG. 10 is a sectional view illustrating a pixel circuit including first to fifth conductive layers, taken along line II-II' shown in FIG. 4. Referring to FIG. 10, another example of the storage capacitor 900 connected between the voltage supply line 710 and the first node N1 will be described.

Referring to FIGS. 4 and 10, the first bridge patterns 621 of the second conductive layer 600 connected to the gate electrode 421 of the driving transistor T1 along with the voltage supply line 710 may form the storage capacitor 900 with the third insulating layer 130 interposed therebetween. For example, in the red sub-pixel included in the one unit pixel, the lower electrode LE of the storage capacitor 900 may be the first bridge patterns 621 of the second conductive layer 600 which are connected to the gate electrode 421 of the driving transistor T1 for driving the red sub-pixel and the upper electrode UE of the storage capacitor 900 may be the voltage supply line 710 of the third conductive layer 700.

In FIG. 10, unlike FIG. 9, at a specific position of the pixel circuit area, the first common electrode line 811 of the fourth conductive layer 800 may be electrically connected to the second bridge patterns 721 of the third conductive layer 700 through the contact holes 831 overlapping with the second bridge patterns 721. Accordingly, the storage capacitor 900 may be formed at the corresponding position by the first common electrode line 811 and the bridge patterns 721. On the other hand, the storage capacitor 900 may be formed by the first bridge patterns 621 of the second conductive layer 600 and the voltage supply line 710 of the third conductive layer 700. Therefore, the bridge patterns 621 may be bridge patterns disposed to overlap with the voltage supply line 710 among bridge patterns connecting the gate electrode 421 and the first common electrode line 811 to each other. Accordingly, the sub-pixels included in the one unit pixel share the voltage supply line 710, so that an overlapping area of the upper electrode UE and the lower electrode LE can increase, thereby increasing a capacitance of the storage capacitor 900.

Hereinafter, a method of manufacturing the display device described with reference to FIGS. 1 to 10 will be described.

Figure 11:
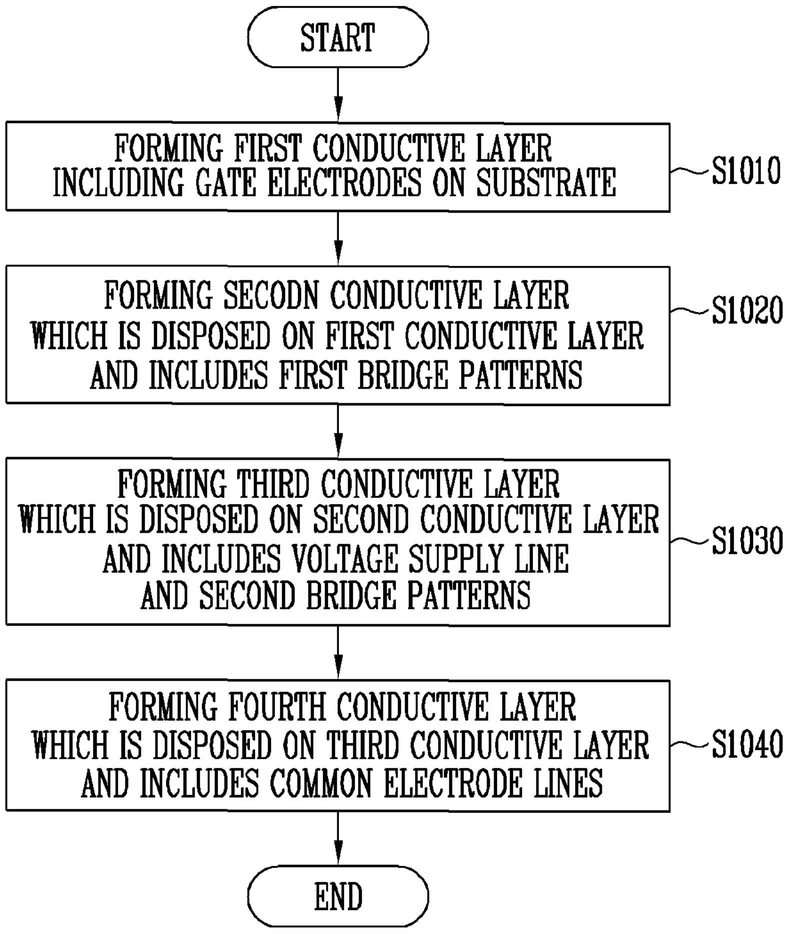
FIG. 11 is a flowchart illustrating an embodiment of a method of manufacturing the display device.

FIG. 11 is a flowchart illustrating an embodiment of a method of manufacturing the display device.

Referring to FIGS. 4 and 11, in S1010, a first conductive layer may be formed on a substrate to include gate electrodes. In embodiments, the first conductive layer 400 may be located between the substrate and a second conductive layer 600, and include gate electrodes respectively disposed in pixel circuit areas arranged in the first direction DR1 on the substrate. For example, the first conductive layer 400 may include gate electrodes 421 and source/drain electrodes 422 of driving transistors T1 and gate electrodes 411 and source/drain electrodes 412 of switching transistors T2, which are included in respective pixel circuits of sub-pixels included in one unit pixel.

The first conductive layer 400 may be formed such that the gate electrodes 421 of the driving transistors T1 and the source electrodes 422 of the switching transistors T2 overlap with each other in the first node N1. In addition, the gate electrodes 421 of the driving transistors T1 and the gate electrodes 411 of the switching transistors T2 may be spaced apart from each other. The gate electrodes 421 of the driving transistors T1 may have a shape extending in the second direction DR2, and the gate electrodes 411 of the switching transistors T2 may have a shape extending in the first direction DR1.

Referring to FIGS. 6 and 11, in S1020, a second conductive layer may be formed on the first conductive layer to include first bridge patterns. In embodiments, the second conductive layer 600 may be located between the first conductive layer 400 and a third conductive layer 700 or between a fifth conductive layer 500 and the third conductive layer 700, and include first bridge patterns 620.

Gate lines 610 included in the second conductive layer 600 may supply a gate signal to the switching transistors T2 of the sub-pixels included in the one unit pixel. The gate lines 610 may be connected to the gate electrodes 411 of the switching transistors T2 included in the first conductive layer 400 via bridge patterns 521 included in the fifth conductive layer 500 through contact holes 631 formed in the second insulating layer 120 disposed on the first conductive layer 400.

The first bridge patterns 620 included in the second conductive layer 600 may be connected to the gate electrodes 421 and the source and drain electrodes 422 of the driving transistors T1 through contact holes 632, 633, and 634 formed in the second insulating layer 120 disposed on the first conductive layer 400, respectively.

In addition, some bridge patterns 622 among the first bridge patterns 620 may be connected to bridge patterns 523 of the fifth conductive layer 500 through contact holes 633, and the bridge patterns 523 may be connected to the source electrodes of the driving transistors T1 through contact holes 534.

Some bridge patterns 623 among the first bridge patterns 620 may correspond to one of bridge patterns for connecting the drain electrodes of the driving transistors T1 to anode electrodes. For example, the bridge patterns 623 may be connected to bridge patterns 524 of the fifth conductive layer 500 through contact holes 634, and the bridge patterns 524 may be connected to the drain electrodes of the driving transistors T1 through contact holes 535.

Referring to FIGS. 7 and 11, in S1030, a third conductive layer may be formed on the second conductive layer 600 to include a voltage supply line and second bridge patterns. In embodiments, the third conductive layer 700 may be disposed on the third insulating layer 130 disposed between the second conductive layer 600 and a third conductive layer 700, and include a voltage supply line 710 and second bridge patterns 720. Also, the third conductive layer 700 may electrically connect the second conductive layer 600 and the fourth conductive layer 800 to each other through contact holes formed in the third insulating layer 130 and the fourth insulating layer 140, respectively. Also, the third conductive layer 700 may form a storage capacitor with the second conductive layer 600 overlapped with the third conductive layer 700 in a plan view.

The voltage supply line 710 included in the third conductive layer 700 may supply a power voltage VDD to the driving transistors T1 of the sub-pixels included in the one unit pixel. The voltage supply line 710 may extend in the first direction DR1 to overlap with the pixel circuit areas. The pixel circuit areas may be areas in which the pixel circuits of the sub-pixels included in the one unit pixel are disposed. That is, the voltage supply line 710 may be formed in one conductive pattern to supply the same power voltage VDD to the sub-pixels included in the one unit pixel.

The voltage supply line 710 may be electrically connected to the source electrodes of the driving transistors T1 of the first conductive layer 400 through contact holes 731 formed in the third insulating layer 130. For example, the voltage supply line 710 may be electrically connected to the source electrodes of the driving transistors T1 via the bridge patterns 622 of the second conductive layer 600 and the bridge patterns 523 of the fifth conductive layer 500.

The second bridge patterns 720 may be connected to some patterns 621 and 623 among the first bridge patterns 620 through second contact holes 732 and 733 formed in the third insulating layer 130 disposed between the second conductive layer 600 and the third conductive layer 700, respectively. For example, some bridge patterns 721 among the second bridge patterns 720 may be connected to the gate electrodes of the driving transistors T1 via the bridge patterns 621 of the second conductive layer 600 and the bridge patterns 522 of the fifth conductive layer 500.

Some bridge patterns 722 among the second bridge patterns 720 may correspond to one of the bridge patterns for connecting the drain electrodes of the driving transistors T1 to the anode electrodes. For example, the bridge patterns 722 may be connected to the drain electrodes of the driving transistors T1 via the bridge patterns 623 of the second conductive layer 600 and the bridge patterns 524 of the fifth conductive layer 500 through contact holes 733 formed in the third insulating layer 130 disposed between the second conductive layer 600 and the third conductive layer 700.

Referring to FIGS. 8 and 11, in S1040, a fourth conductive layer 800 may be formed on the third conductive layer 700 to include common electrode lines. In embodiments, the fourth conductive layer 800 may be disposed on the third conductive layer 700 with the fourth insulating layer 140 disposed between the third conductive layer 700 and the fourth conductive layer 800, and include common electrode lines 810. The fourth conductive layer 800 may include the common electrode lines 810 which are electrically connected to the gate electrodes through the first bridge patterns 620 and the second bridge patterns 720 and are electrically separated from the voltage supply line 710.

The common electrode lines 810 may be arranged in the second direction DR2 intersecting the first direction DR1. Each of the common electrode lines 810 may extend in the first direction DR1 to overlap with the pixel circuit areas. The common electrode lines 810 may be spaced apart from each other in the second direction DR2 in which the common electrode lines 810 are arranged.

A number of the common electrode lines 810 may be equal to a number of the sub-pixels included in the one unit pixel. For example, the common electrode lines 810 may be formed by a number of the sub-pixels included in the one unit pixel to be connected to the respective gate electrodes including in the pixel circuits of the sub-pixels.

The common electrode lines 810 may be electrically connected to the gate electrodes of the driving transistors T1 through the second bridge patterns 721, the first bridge patterns 621, and the third bridge patterns 522. The fourth insulating layer 140 disposed between the third conductive layer 700 and the fourth conductive layer 800 may include first contact holes 831, 832, and 833. Each of the common electrode lines 810 may be connected to the second bridge patterns through the first contact holes 831, 832, and 833 and be connected to the gate electrodes of the corresponding sub-pixel via the second bridge patterns and the first bridge patterns, which overlap with each other. On the other hand, since each of the common electrode lines 810 does not include any contact hole in an area except a pixel circuit area of a corresponding sub-pixel, each of the common electrode lines 810 may be electrically separated from the third conductive layer 700.

Also, the common electrode lines 810 along the voltage supply line 710 may form a first storage capacitor. The common electrode lines 810 are not electrically connected the voltage supply line 710 overlapping with the pixel circuit areas included in the one unit pixel but separated from the voltage supply line 710, thereby forming a storage capacitor between the common electrode lines 810 and the voltage supply line 710.

Fourth bridge patterns 820 may correspond to one of the bridge patterns for connecting the drain electrodes of the driving transistors T1 to the anode electrodes. For example, the fourth bridge patterns 820 may correspond to the second node N2 connected to the anode electrode, and the fourth bridge patterns 820 may be connected to the drain electrodes of the driving transistors T1 via the bridge patterns 722 of the third conductive layer 700, the bridge patterns 623 of the second conductive layer 600, and the bridge patterns 524 of the fifth conductive layer 500. The drain electrode of the driving transistor T1 may be electrically connected to the anode electrode of the organic light emitting diode through the corresponding path. A fifth insulating layer 150 may be formed on the fourth conductive layer 800.

In accordance with the present disclosure, there can be provided a display device capable of including electric elements with an ultra-high resolution in a relatively small area, and a method of manufacturing the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:

a substrate;

a first conductive layer including gate electrodes respectively disposed in pixel circuit areas arranged in a first direction on the substrate;

a second conductive layer disposed on the first conductive layer, the second conductive layer including first bridge patterns;

a third conductive layer disposed on the second conductive layer, the third conductive layer including a voltage supply line for supplying a driving voltage and second bridge patterns; and a fourth conductive layer disposed on the third conductive layer, the fourth conductive layer including common electrode lines which are electrically connected to the gate electrodes through the first bridge patterns and the second bridge patterns and are electrically disconnected from the voltage supply line, wherein the common electrode lines are arranged in a second direction intersecting the first direction, and each of the common electrode lines extends in the first direction to overlap with the pixel circuit areas.

2. The display device of claim 1, wherein each of the common electrode lines along with the voltage supply line forms a first storage capacitor.

3. The display device of claim 2, wherein each of the first bridge patterns along with the voltage supply line forms a second stage capacitor.

4. The display device of claim 1, wherein the voltage supply line extends in the first direction to overlap with the pixel circuit areas.

5. The display device of claim 1, wherein pixel circuits of sub-pixels included in one unit pixel are disposed in the pixel circuit areas, and the gate electrodes are respectively included in the pixel circuits of the sub-pixels.

6. The display device of claim 5, wherein a number of the common electrode lines in the one unit pixel is equal to a number of the sub-pixels included in the one unit pixel.

7. The display device of claim 1, wherein the first bridge patterns and the second bridge patterns overlap with each other, wherein the common electrode lines are connected to the second bridge patterns through first contact holes, and wherein the second bridge patterns are connected to the first bridge patterns through second contact holes.

8. The display device of claim 7, wherein the common electrode lines in one unit pixel are connected to the second bridge patterns through the first contact holes, respectively.

9. The display device of claim 1, further comprising a fifth conductive layer including a data line for supplying a data signal and disposed between the first conductive layer and the second conductive layer.

10. The display device of claim 9, wherein the fifth conductive layer further includes third bridge patterns, and wherein the common electrode lines are electrically connected to the gate electrodes through the first bridge patterns, the second bridge patterns, and the third bridge patterns.

11. The display device of claim 1, wherein the second conductive layer further includes gate lines for supplying a gate signal.

12. A method of manufacturing a display device, the method comprising:

forming a first conductive layer including gate electrodes respectively disposed in pixel circuit areas arranged in a first direction on a substrate;

forming a second conductive layer disposed on the first conductive layer, the second conductive layer including first bridge patterns;

forming a third conductive layer disposed on the second conductive layer, the third conductive layer including a voltage supply line for supplying a driving voltage and second bridge patterns; and forming a fourth conductive layer disposed on the third conductive layer, the fourth conductive layer including common electrode lines which are electrically connected to the gate electrodes through the first bridge patterns and the second bridge patterns and are electrically disconnected from the voltage supply line, wherein the common electrode lines are arranged in a second direction intersecting the first direction, and each of the common electrode lines extends in the first direction to overlap with the pixel circuit areas.

13. The method of claim 12, wherein each of the common electrode lines along with the voltage supply line forms a first storage capacitor.

14. The method of claim 13, wherein each of the first bridge patterns along with the voltage supply line forms a second stage capacitor.

15. The method of claim 12, wherein the voltage supply line extends in the first direction to overlap with the pixel circuit areas.

* * * * *